(12) United States Patent
Khalid

(10) Patent No.: US 7,167,041 B2
(45) Date of Patent: *Jan. 23, 2007

(54) VOLTAGE BUFFER FOR CAPACITIVE LOADS

(75) Inventor: Shahzad Khalid, Union City, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/225,312

(22) Filed: Sep. 12, 2005

(65) Prior Publication Data

US 2006/0007726 A1 Jan. 12, 2006

Related U.S. Application Data

(63) Continuation of application No. 10/356,098, filed on Jan. 30, 2003, now Pat. No. 7,002,401.

(51) Int. Cl.
*G05F 1/10* (2006.01)

(52) U.S. Cl. .................. 327/541; 327/543; 327/108

(58) Field of Classification Search ............. 327/112, 327/540, 541, 543; 323/315, 316; 365/189.05
See application file for complete search history.

(56) References Cited

U.S. PATENT DOCUMENTS

| | | | |
|---|---|---|---|
| 3,895,238 A | 7/1975 | Saari | |
| 4,263,519 A | 4/1981 | Schade | ........................ 327/539 |
| 4,684,824 A | 8/1987 | Moberg | |
| 5,047,657 A * | 9/1991 | Seevinck et al. | ........... 327/306 |
| 5,184,035 A | 2/1993 | Sugibayashi | |

(Continued)

FOREIGN PATENT DOCUMENTS

GB    2370704 A    7/2002

(Continued)

OTHER PUBLICATIONS

Notification Concerning Transmittal of Copy of International Preliminary Report on Patentability, International Application No. PCT/US2004/001198 for SanDisk Corporation, mailed Aug. 18, 2005, 7 pages.

(Continued)

*Primary Examiner*—Long Nguyen
(74) *Attorney, Agent, or Firm*—Parsons Hsue & de Runtz LLP

(57) ABSTRACT

A voltage buffer for capacitive loads isolates the load from the feedback loop. Using a variation of a follower arrangement, a second transistor outside of the feedback loop introduced. The current to the load is supplied through the second transistor, which is connected to have the same control gate level as the transistor in the feedback loop and provide an output voltage based on the reference input voltage. The output voltage is dependent upon the input voltage, but the load is removed from the feedback loop. By removing the load from the feedback loop, the loop is stabilized with only a very small or no compensating capacitor, allowing the quiescent current of the buffer to be reduced and the settling time to be improved. One preferred use of the present invention is to drive the data storage elements of a non-volatile memory.

14 Claims, 2 Drawing Sheets

U.S. PATENT DOCUMENTS

| | | | |
|---|---|---|---|
| 5,359,295 A | 10/1994 | Nishimura | |
| 5,397,938 A | 3/1995 | Wilhelm et al. | |
| 5,475,339 A | 12/1995 | Maida | |
| 5,726,936 A | 3/1998 | Whitfield | |
| 5,739,712 A * | 4/1998 | Fujii | 327/541 |
| 5,959,475 A * | 9/1999 | Zomorrodi | 327/112 |
| 6,043,570 A | 3/2000 | Kurata et al. | |
| 6,075,391 A | 6/2000 | Tarantola et al. | |
| 6,114,843 A | 9/2000 | Olah | 327/280 |
| 6,140,847 A | 10/2000 | Le Campion | |
| 6,150,872 A | 11/2000 | McNeill et al. | 327/539 |
| 6,157,255 A | 12/2000 | Felps | |
| 6,381,491 B1 | 4/2002 | Maile et al. | 327/539 |
| 6,529,066 B1 | 3/2003 | Guenot et al. | 327/539 |
| 6,608,472 B1 | 8/2003 | Kutz et al. | 323/313 |
| 7,002,401 B1 * | 2/2006 | Khalid | 327/541 |
| 2001/0004581 A1 | 6/2001 | Geri | |

FOREIGN PATENT DOCUMENTS

| | | |
|---|---|---|
| JP | 62-283714 | 9/1987 |
| JP | 62-283716 | 9/1987 |
| JP | 62-283717 | 9/1987 |
| JP | 11-184430 | 7/1999 |
| JP | 2000-165156 | 6/2000 |
| JP | 2000-183666 | 6/2000 |

OTHER PUBLICATIONS

Martin et al., "Analog Integrated Circuit Design," *Wiley & Sons, Inc.*, 1997, pp. 125-303.

Kenney et al., "An Enhanced Slew Rate Source Follower," *IEEE Journal of Solid State Circuits*, vol. 30, No. 2, Feb. 1995, pp. 144-146.

International Search Report mailed Jun. 18, 2004.

* cited by examiner

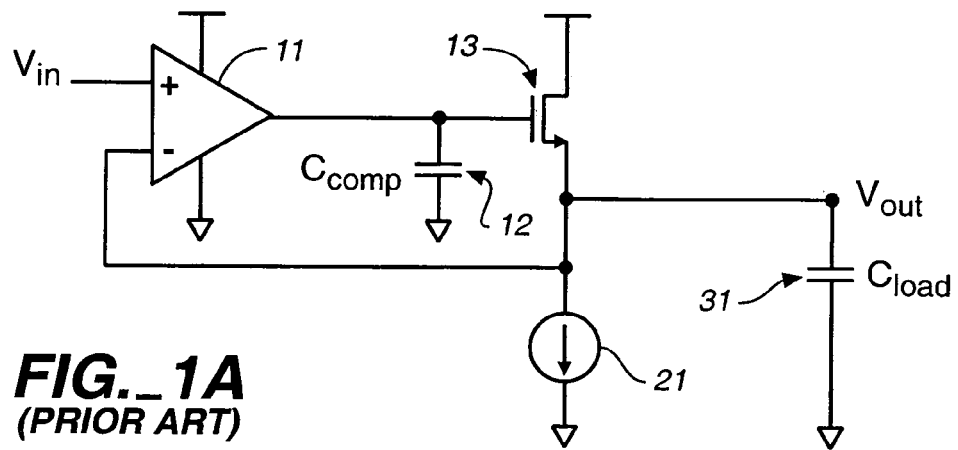
FIG._1A
*(PRIOR ART)*
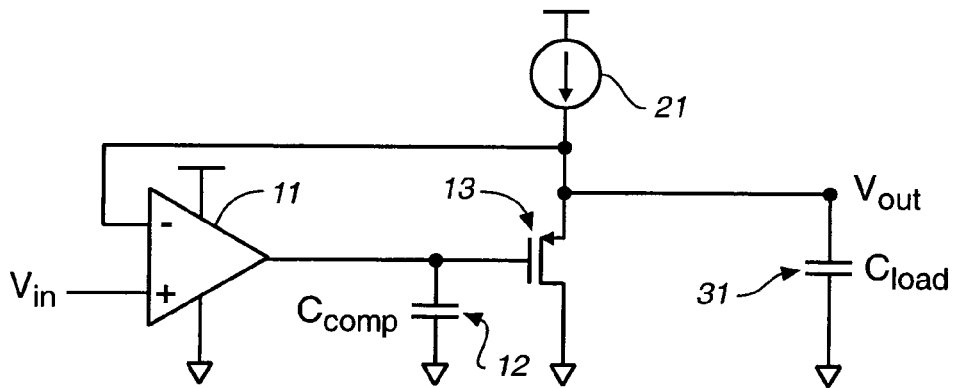
FIG._1B
*(PRIOR ART)*
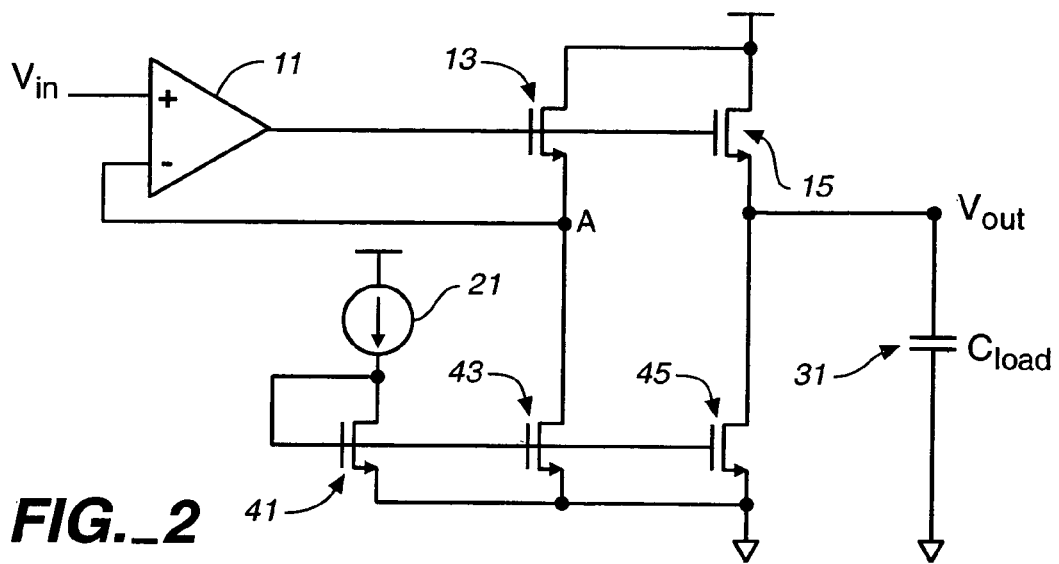
FIG._2

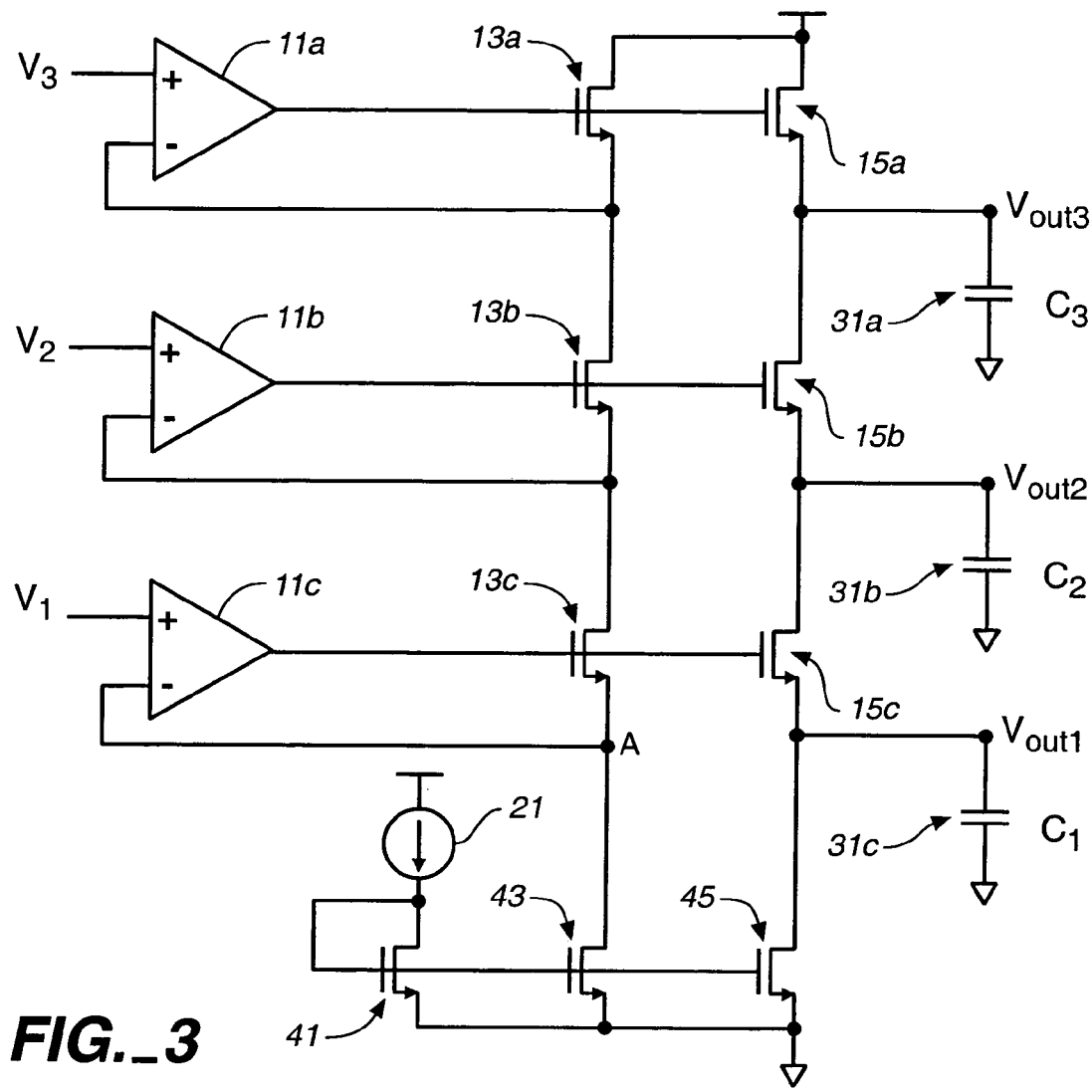
FIG._3
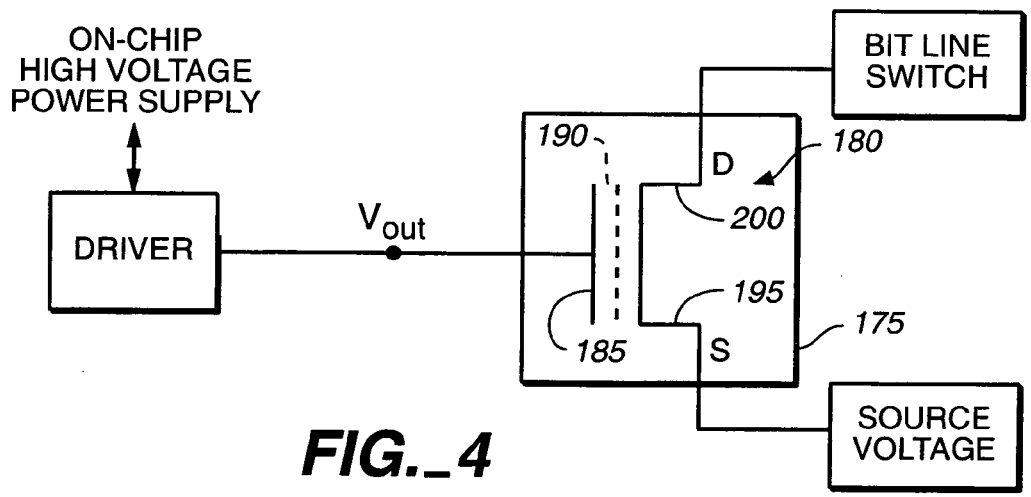
FIG._4

VOLTAGE BUFFER FOR CAPACITIVE LOADS

CROSS-REERENCE TO RELATED APPLICATION

This application is a continuation of application Ser. No. 10/356,098, filed on Jan. 30, 2003, now U.S. Pat. No. 7,002,401 B2, which is hereby incorporated by this reference.

BACKGROUND OF THE INVENTION

This invention pertains to voltage buffers to drive analog voltages, and, in particular, relates voltage buffers for large and potentially variable capacitive loads.

A conventional driving circuit or driver for a capacitive load typically consists of a signal input, a signal output, and an amplifier of an analog voltage buffer to drive the load. A common example of such a circuit is shown in FIG. 1a. A driver of this kind is used when it is wanted to apply a reference voltage, $V_{in}$, to a load, but the source of the reference voltage cannot drive the load sufficiently. This particular example uses an amplifier with a source follower output stage. Other examples include using am amplifier with a class A or a class A/B output stage. In all of cases, the output voltage, $V_{out}$, is taken of a node in the feedback loop for the op-amp or differential gain stage 11 and, consequently, the load, $C_{load}$ 31, is part of the feedback loop.

Considering FIG. 1a in move detail, an input voltage $V_{in}$ is supplied to a buffer including differential gain stage 11 connected between a voltage source and, through current limiter 21, ground, where the transistor 13, here an NMOS, is explicitly shown. The feedback loop to the amplifier 11 is closed from a node between the transistor 13 and the current limiter, from which is also supplied the output voltage, $V_{out}$. Consequently, the load to which the output voltage is applied, $C_{load}$ 31, is part of the feedback loop. (The capacitor $C_{comp}$ is discussed below). Instead of the NMOS transistor shown in FIG. 1a for the output transistor 13, variations on this source follower arrangement could also use PMOS, npn, pnp, or MESFET transistors, as is known in the art. For example, a PMOS transistor could be used for output transistor 13, in which case the rest of FIG. 1a would be changed as shown in FIG. 1b, with the current limiter 21 now placed between the voltage source and ground, and with both the output and the feedback loop to the differential gain stage or op-amp 11 coming from nodes above the PMOS but below the current limiter. As already noted, a class A and class A/B output stage could replace the shown source follower setup of either FIG. 1a or 1b. In addition, the circuits can more generally be connected between two arbitrary voltage levels, where the lower of these is taken as ground in the following to simplify the discussion.

FIG. 4 shows a particular example of an application for a driver such as that shown in FIG. 1a or 1b, as well as for those of the present invention as described below. The driver of these figures is particularly useful in a non-volatile memory system, such as an Electrically Erasable Programmable Read Only Memory (EEPROM) or flash memory having a number of storage elements or cells for storing data therein. An example of a storage element in a memory system is shown in FIG. 4. For purposes of clarity, many of the details of storage elements that are widely known and are not relevant to the present invention have been omitted. Storage elements are described in more detail in, for example, U.S. Pat. No. 5,862,080, which is incorporated herein by reference. Referring to FIG. 4, a memory system typically includes a number of storage elements 175, each having one or more Field Effect Transistors (FETs 180) each having one or more control gate or gate 185 and isolated or floating gate 190, which is electrically isolated from source 195 and drain 200 of the FET. Because gate 185 capacitively couples with floating gate 190, storage element 175 appears to the driver as a capacitive load. Because a large number of storage elements in the non-volatile memory system (not shown) are typically programmed simultaneously, and because a large number of the gates 185 in storage element 175 must be switched simultaneously between a programming voltage and a verify voltage to program the storage element, the gates appear to driver 100 as a single, large capacitive load. The voltage, $V_{out}$, supplied to the memory storage based on the input voltage, $V_{in}$, can be any of the various programming, read/verify, or other voltages supplied to the storage element during operation of the memory from the power or a high-voltage pump (not shown), either on the same chip as the memory array or from another chip in the memory system. Further examples of such systems where such voltage buffer could be used are given in the following U.S. patents and pending applications that are incorporated herein in their entirety by this reference: U.S. Pat. Nos. 5,095,344, 5,172,338, 5,602,987, 5,663,901, 5,430,859, 5,657,332, 5,712,180, 5,890,192, 6,151,248, and 6,426,893 and Ser. No. 09/667,344, filed Sep. 22, 2000, and Ser. No. 09/893,277, filed Jun. 27, 2001.

Although the designs discussed with respect to FIGS. 1a and 1b provide a unity gain buffer for driving an analog voltage, such as the capacitive loads found in a non-volatile memory, they have several shortcomings. For stability, the feedback loop should have a dominant pole. In the arrangement of FIG. 1a or 1b, the are two contributions to the loop: one from the output node of differential gain stage 11, that is connected to the gate of transistor 13, and the other at the node $V_{out}$, that is connected to $C_{load}$ 31. In many applications, such as the EEPROM example shown in FIG. 4, the driven load has a variable value so that there is no clearly dominant pole in the loop. Thus, the sort of prior art design shown in FIG. 1 is prone to oscillations and slow settling times. A standard prior art technique to stabilize the circuit is to introduce the compensating capacitor $C_{comp}$ 12 between the output of the differential gain stage 11 and ground, where value of $C_{comp}$ is taken large enough to maintain the dominance of the corresponding pole.

Although the compensation capacitor will stabilize the driver circuit, as the load $C_{load}$ can be quite large in some applications, the value of $C_{comp}$ needs to increase proportionally. This results in the circuit responding slowly as $C_{comp}$ must be charged. In addition to the long settling time, this also can result in large quiescent currents through the differential gain stage or op-amp 11 in order to charge $C_{comp}$.

SUMMARY OF THE INVENTION

According to one principal aspect of the present invention, briefly and generally, the present invention overcomes these problems by presenting a voltage buffer for capacitive loads that isolates the load from the feedback loop. A variation on the source follower arrangement is used where, instead of the output voltage being taken from the source side of a transistor in a feedback loop, a second transistor outside of the feedback loop introduced. The current to the load is instead supplied through the second transistor, which is connected to have the same control gate level as the transistor in the feedback loop and provide an output voltage based on the reference input voltage. In this way, the output voltage is dependent upon the input voltage, but the load is removed from the feedback loop. The exemplary embodiment provides unity gain.

In an exemplary embodiment, the buffer circuit contains a differential gain stage that receives the reference voltage at one input and has an output connected to the control gate of a transistor. This output transistor is connected between a power supply and, through a current limiting circuit, ground. Connecting the second input of the differential gain stage to a node between the output transistor and the current limiter completes a feedback loop. The output of the differential gain stage is also connected to a second transistor connected between the power supply and, again through the current limiter, ground. The output voltage is then taken from a node between this second transistor and the current limiter. The current limiting circuit uses a current mirror, where the output transistor and the second transistor are connected to ground through different legs of the current mirror. The exemplary embodiment is based on NMOS transistors, although other implementations are discussed. In a further embodiment, a number of such circuits are connected in series to drive multiple loads each based on a different reference voltage.

In a principle aspect of the present invention, by removing the load from the feedback loop, the loop is stabilized. In another aspect of the present invention, this stabilization is achieved without the need of a compensating capacitor or with a much smaller compensating capacitor than in the prior art, allowing the quiescent current of the buffer to be reduced and the settling time to be improved. One preferred use of the present invention is to drive the data storage elements of a non-volatile memory.

Additional aspects, features and advantages of the present invention are included in the following description of exemplary embodiments, which description should be read in conjunction with the accompanying drawings.

BRIEF DESCRIPTION OF THE DRAWINGS

FIGS. 1a and 1b are prior art examples of a voltage buffer used to drive capacitive load.

FIG. 2 illustrates a first embodiment of the present invention.

FIG. 3 shows an alternate embodiment of the present invention.

FIG. 4 is a block diagram of a storage element in a non-volatile memory system in which a driver according to an embodiment of the present invention could be employed.

DESCRIPTION OF EXEMPLARY
EMBODIMENTS OF THE INVENTION

A first exemplary embodiment of the present invention is shown in FIG. 2. As is described in the following, this provides a unity gain buffer able to drive analog voltages on large and potentially variable capacitive loads with small quiescent current and fast settling times. In particular, in the design of FIG. 2, although the reference voltage $V_{in}$ still determines the level on the node $V_{out}$ connected to the load $C_{load}$ 31, this node has been isolated from the feedback loop to the differential gain stage 11. Although the design of FIG. 2 uses a variation of source follower output stage, this isolating of the load allows the feedback loop to be stabilized in the presence of large loads without having to add large compensation capacitors, such as $C_{comp}$ 12 in FIGS. 1a and 1b, to introduce a dominant pole in the loop.

FIG. 2 again shows a reference voltage $V_{in}$ applied to a first input of differential gain stage or op-amp 11, whose output is connected to the control gate of a transistor 13 connected between a voltage source and, through a current limiter, ground. The other input of the differential gain stage 11 is connected to a node between the transistor 13 and the current limiter, thereby completing the feedback loop. The output voltage, $V_{out}$, applied to the load $C_{load}$ 31 is no longer taken from the feedback loop, as it was in FIG. 1. Instead, a second transistor 15 is placed between the voltage source and, through a current limiter, ground in parallel with transistor 13. The control gate of transistor 15 is also, along with the control gate of transistor 13, connected the output of differential gain stage 11 and the output $V_{out}$ is now instead taken from a node between transistor 15 and the current limiter. Examples of differential gain stages or operational amplifiers suitable for use as element 11 are described, for example, in FIG. 3.19 or 6.10 of "Analog Integrated Circuit Design", David A. Johns and Ken Martin, John Wiley & Sons, 1997, which is hereby incorporated by this reference.

The current limiter in the exemplary embodiment is taken to be a current mirror, with the transistor 13 connected to ground through the leg with transistor 43 and the transistor 15 connected to ground through the leg with transistor 45. The current level in the mirror is set by a current source 21 connected to ground through transistor 41 and also connected to the transistor's control gate. The circuit is arranged so that the ratio of the width of transistor 13, $W_{13}$, to the width of transistor 15, $W_{15}$, is the same as the ratio of the width of transistor 43, $W_{43}$, to the width of transistor 45, $W_{45}$: $(W_{13}/W_{15})=(W_{43}/W_{45})$. For example, this can be done by taking $W_{13}=\alpha W_{15}$ and $W_{43}=\alpha W_{45}$ for some constant $\alpha$. In this way, the output voltage is set to the same value as the voltage at node A (where the output was taken in FIG. 1a), $V_{out}=V_A$, and, consequently, the load is driven to the same voltage value as the reference voltage of $V_{in}$, where these relations are somewhat approximate due to the various offset in an actual circuit. Although the exemplary embodiment is for a unity gain buffer, the described embodiments of the present invention readily adapt to other amounts of gain by, for example, introducing resistances into the feedback loop, as is known in the art.

Although the circuit of FIG. 2 will drive the output $V_{out}$ to the reference voltage $V_{in}$, $C_{load}$ is decoupled from the feedback loop, which is consequently stabilized. Furthermore, the settling time is quicker than that of the circuits of FIGS. 1a and 1b, as there is no longer the need for the introduction of a compensating capacitance $C_{comp}$ of the magnitude needed in the prior art that would instead increase the settling time, and the quiescent current through the differential gain stage or op-amp is lessened, as this current no longer needs to charge up $C_{comp}$. The following discussion will be for the case where $C_{comp}$ 12 of FIGS. 1a and 1b is absent, although there may be situations where a small compensating capacitance is also used in conjunction with the various embodiments of the present invention. However, an advantage of the present invention is that even when such a compensation capacitor is included, it will very small compared to that need in the prior art.

In another aspect of the present invention, as the relative widths of the transistors can be independently chosen as long as the ratio $(W_{13}/W_{15})=(W_{43}/W_{45})$ is maintained, they can be optimized according to the application and their specific functions. The size of transistor 15 can be chosen large enough to supply sufficient current to drive the capacitive load $C_{load}$ while keeping the current through the output transistor 13 lower than needed in transistor 15 and, consequently, lower than needed for transistor 13 in the design of FIG. 1. The current limiting mirror then is taken with unequal legs at transistors 43 and 45 to maintain the needed ratio for the correct output level. An exemplary embodiment uses transistors in the right leg with a width of around ten times that in the left leg: $W_{13}=W_{43}=W$ and $W_{15}=W_{45}=10W$. (In many applications, current source 21 and transistor 41 are common to many elements of the circuit and, therefore, more of less fixed as seen by the circuit of FIG. 2. The sizes of transistors 43 and 45 relative to transistor 41 are then selected according to their current needs while maintaining the ratio for transistors 13, 15, 43, and 45.)

A particularly useful application of the driver of FIG. 2 is again in a non-volatile memory system, such as is shown in FIG. 4. In this case the size of the transistors supplying the output voltage could be selected based on how much current is needed to drive the word lines. Here, the voltage buffer would be connectable to supply the various voltages needed to drive the non-volatile data storage element, as described in detail in the various patents and applications incorporated by reference above. In the shown embodiment of FIG. 4, the data storage element is a floating gate field effect transistor, such as found in a flash EEPROM memory. When the buffer is connected to the memory cell 175, the output voltage applied to the control gate 185 based on an input reference voltage is any of the various voltages used in a read, write, or erase process. Consequently, the power supply connected to the buffer must be sufficient to meet these voltage needs. A more specific example where a driver of the type shown in FIG. 2 could be used is as the buffers in U.S. Pat. No. 6,486,715, which is hereby incorporated by this reference.

Although the exemplary embodiment of FIG. 2 uses NMOS transistors for the output transistor 13 as well as the other transistors, as in FIG. 1a these could be replaced with a PMOS, npn, pnp, MESFET, or other implementations. For example, in the case of PMOS transistors, the circuit would be "flipped over" in the manner described in the Background section for the PMOS version of FIG. 1b. More generally, in the embodiment of FIG. 2, the transistors 13 and 15 are connected between a first voltage level and, through a current limiting circuit including transistors 43 and 45, to a second voltage level. Node A (for the feedback loop) and the $V_{out}$ node taken between the respective transistors 13 and 15 and the current limiter. In the shown NMOS embodiment, the second reference level is taken as ground. In a PMOS embodiment the first reference level would be ground (or at least the lower of the two reference levels), which would be separated from node A by transistor 13 and from the $V_{out}$ node by transistor 15, with both of these nodes now connected to the upper voltage level through the current limiter.

A second embodiment of the present invention allows use of multiple such buffers in a serial chain. An example with three such buffers shown in FIG. 3, again shown in an NMOS implementation. More generally, there can be any number of such buffers connected in this way and PMOS, npn, pnp, MESFET, or other implementation variations can be used. The input voltages are arranged such that $V_3 > V_2 > V_1$, or more generally, $V_n > V_{(n-1)} > \ldots > V_2 > V_1$. If the desired output voltages do not satisfy $V_{outn} > V_{out(n-1)} > \ldots > V_{out2} > V_{out1}$, their connections can be rearranged accordingly.

The output transistors 13a–c of the left side are all connected in series, as are the driving transistors 15a–c of the right leg, with the respective feedback loops being closed on the current limiter side of each output transistor and the respective output voltages taken on the current limiter side of each driving transistor. The current of the two sides then run to the legs of the (generally unequal) current mirror made up of transistors 41, 43, and 45 and current source 21. In all of the buffers, the output transistors 13a–c and driving transistors 15a–c, along with the two mirroring transistors 43 and 45, are again respectively ratioed so that the output voltages $V_{out1}$–$V_{out3}$ correspond to the input voltages $V_1$–$V_3$, respectively. For example, this could be $W_{15a}=W_{15b}=W_{15c}=W_{45}=\alpha W_{13a}=\alpha W_{13b}=\alpha W_{13c}=\alpha W_{43}$, where the proportionality factor is again $\alpha=10$ or some other suitable value. This again allows the width of the driving transistors 15a–c to be chosen based on the current needs of the loads $C_1$–$C_3$ 31a–c, while maintaining lower current levels through the output transistors 13a–c.

The design of FIG. 3 is particular useful in the case where the individual loads $C_1$–$C_n$ are variable, but their sum $(C_1+C_2+\ldots+C_n)=C_{total}$ is constant. Although three separate circuits as in FIG. 2 could drive the loads 31a–c of FIG. 3, the arrangement of FIG. 3 can have several advantages. If three individual buffers were used, each would need to be able to drive the maximum load $C_{total}$. Consequently, if the current needed to drive the maximum load in each buffer is $I_{max}$, the total current requirement would be $nI_{max}$, whereas the design of FIG. 3 only needs (ignoring the other variations) a current of $I_{max}$ to drive all of the loads. Thus, as the transistors in both the right leg and the left leg are each connected series, the current flowing in design of FIG. 3 is reduced by a factor $\sim 1/n$ relative to that which would be needed for three copies of the design of FIG. 2. Also, whereas using separate drivers for the loads 31a–c would result in the capacitances $C_1$–$C_3$ charging at different rates, the design of FIG. 3 allows these loads to all charge up together. It should also be noted that the quiescent current is also correspondingly reduced relative to a design that would introduce a compensating capacitance for each feedback loop.

Although the invention has been described with respect to various exemplary embodiments, it will be understood that the invention is entitled to protection within the full scope of the appended claims.

It is claimed:

1. A circuit to supply, at an output node, an output voltage from an input voltage, the circuit comprising:
    a current limiting circuit including a current mirror having a first transistor and a second transistor whose control gates are connected;
    a third transistor and a fourth transistor connected in parallel between a first of a voltage source and a reference voltage and, respectively through the first and second transistors, a second of the voltage source and the reference voltage; and
    a differential gain stage having a first input connected to receive the input voltage, a second input connected to a first node between the first and third transistors, and an output connected to the control gate of the third and fourth transistors, wherein the output node of the circuit is between the second and fourth transistors and wherein the first, second, third and fourth transistors are of the same type.

2. The circuit of claim 1, wherein said circuit is of unity gain.

3. The circuit of claim 1, wherein the first of the voltage source and the reference voltage is the reference voltage, the reference voltage is ground and the second of the voltage source and the reference voltage is the voltage source, and wherein said first, second, third and fourth transistors are of the PMOS type.

4. The circuit of claim 1, wherein the fourth transistor has a channel width channel width approximately ten times the channel width of the third transistor.

5. A memory system, comprising:
one or more non-volatile data storage elements;
a voltage source; and
a voltage buffer connectable to supply an output voltage to said data storage elements, comprising:
   a current limiting circuit including a current mirror having a first transistor and a second transistor whose control gates are connected;
   a third transistor and a fourth transistor connected in parallel between a first of a voltage source and a reference voltage and, respectively through the first and second transistors, a second of the voltage source and the reference voltage; and
   a differential gain stage having a first input connectable to receive an input voltage, a second input connected to a node between the first and third transistors, and an output connected to the control gate of the third and fourth transistors, wherein the output voltage is supplied from a node between the second and fourth transistors and wherein the first, second, third and fourth transistors are of the same type.

6. The memory system of claim 5, wherein the data storage elements are transistors and wherein when the voltage buffer is connected to the data storage elements the output voltage is supplied to the control gates of the data storage elements.

7. The memory system of claim 6, wherein said data storage elements are floating gate field effect transistors.

8. The memory system of claim 5, wherein said output voltage is a voltage for use in a programming process.

9. The memory system of claim 5, wherein said output voltage is a voltage for use in a read process.

10. The memory system of claim 5, wherein said output voltage is a voltage for use in an erase process.

11. The circuit of claim 5, wherein said voltage buffer is of unity gain.

12. The circuit of claim 5, wherein the first of the voltage source and the reference voltage is the voltage source, the second of the voltage source and the reference voltage is the reference voltage and the reference voltage is ground, and wherein said first, second, third and fourth transistors are of the NMOS type.

13. The circuit of claim 5, wherein the first of the voltage source and the reference voltage is the reference voltage, the reference voltage is ground and the second of the voltage source and the reference voltage is the voltage source, and wherein said first, second, third and fourth transistors are of the PMOS type.

14. The circuit of claim 5, wherein the fourth transistor has a channel width channel width approximately ten times the channel width of the third transistor.

* * * * *